PHASE MODULATING DEVICE

Filed Oct. 19, 1955 2 Sheets-Sheet 1

INVENTOR.
Benjamin Kazan
BY
Charles H. Brown
ATTORNEY

INVENTOR.
Benjamin Kazan
BY
Charles H. Brown
ATTORNEY

United States Patent Office 2,818,548 Patented Dec. 31, 1957

2,818,548

PHASE MODULATING DEVICE

Benjamin Kazan, Princeton, N. J., assignor to Radio Corporation of America, a corporation of Delaware Application October 19, 1955, Serial No. 541,383

21 Claims. (Cl. 332—3)

This invention relates to phase modulating systems, and particularly concerns a photoconductive device useful for phase modulating a radio frequency signal and to means for effecting such modulation.

Generally, the phase modulating devices presently found in the art comprise one or more evacuated electron discharge tubes and the necessary electronic circuitry for operating the tubes. The devices are often complicated in construction and include a large number of circuit elements. Further, the operation of such devices can be extremely complex, requiring critical tuning adjustments to obtain the proper operation of the tubes and circuit elements included in the devices. The present trend in electronic equipment is toward the development of electronic devices and circuits which are simple in operation and constructed of a minimum number of simple circuit elements, while retaining the desired degree of reliability and quality of operation. It is important in certain applications of electronic equipment that the circuit elements as, for example, the circuit elements included in a phase modulating device, occupy as small a space as possible. The photoconductive device of the invention is simple and compact and enables simplification of and a reduction in the number of circuit elements used in the construction of a phase modulating device.

It is an object of this invention, therefore, to provide a new and improved means for phase modulating signal energy.

It is a further object of the invention to provide a novel compact and simple device for phase modulating a radio frequency signal by the use of photoconductive material.

Briefly, the invention is a phase modulating device, the operation of which is dependent upon the electrical properties of a photoconductive material, for example, cadmium sulfide or cadmium selenide. The operating characteristics of such photoconductive materials, which belong to the group of semiconductor materials, are well known in the art. A photoconductive material in the dark normally presents a high electrical impedance to the flow of alternating current approaching that of an insulator. However, when the photoconductive material is subjected to illumination by electromagnetic radiations of a frequency appearing within the visible, infra-red, ultraviolet or X-ray region of the spectrum, the electrical impedance of the material is reduced and permits current flow and, therefore, electrical coupling through the material of a magnitude which depends upon the particular photoconductive material used. The illumination causes the resistivity of the photoconductive material to change. This change in resistivity is utilized in accordance with the invention to translate modulated light rays projected onto the material into electrical energy, the characteristics of which are determined in part at least by the application of a varying waveform applied to the material.

In the construction of the photoconductive device of the invention, a transparent, metallic, conducting coating is positioned on a surface of a transparent glass plate.

The coating may be arranged to cover the entire surface of the plate or may be arranged in a line pattern in a predetermined manner. A layer of photoconductive material of given dimensions has one side in contact with the conducting coating. A delay line, preferably, in the form of a metallic, helical, coiled winding is placed in contact with the opposite side of the photoconductive layer. The winding is arranged so that contact is made between the layer of photoconductive material and each turn of the winding, the points of contact being spaced the same distance apart along the length of the winding. A radio frequency wave is applied from a suitable source to one end of the winding. The other end of the winding is terminated to prevent reflections. An output circuit including a load resistor is connected to the conducting coating. Neglecting attenuation in the delay line, the phase of the radio frequency wave will vary along the length of the delay line.

In the absence of illumination, the alternating current impedance of the layer of photoconductive material is relatively high adding to the distributed capacity of the delay line. Assuming that the delay line has a length which is an integral number of wavelengths at the operating radio frequency, a radio frequency signal does not appear on the conducting coating due, in effect, to the different radio frequency phases cancelling out. In one embodiment, light rays are focused by optical means and projected in the form of a spot of light through the glass plate and conducting coating onto a particular point in the body of the layer of photoconductive material. The impedance of the photoconductive material at the point illuminated by the spot of light is lowered, and the conducting coating is coupled to the contact point of the delay line immediately adjacent the illuminated point of the photoconductive material. The spot of light is deflected in position in accordance with an audio signal or other modulating potential in alternately opposite directions along the layer of photoconductive material on a line parallel to an imaginary line drawn through the points of contact between the photoconductive material and the delay line. The phase of the radio frequency wave or signal applied to the delay line is sampled at the various points of contact of the delay line, according to the range of deflection of the spot of light which depends, in turn, on the level of the modulating potential. The radio frequency signal coupled to the conducting coating by the selective illumination of the different points in the layer of the photoconductive material is phase modulated by the sampling of the phase of the radio frequency wave or signal, and a phase modulated radio frequency signal appears across the load resistor in the output circuit of the device.

A more complete description of the invention will be given in connection with the accompanying drawing in which.

Figure 1:
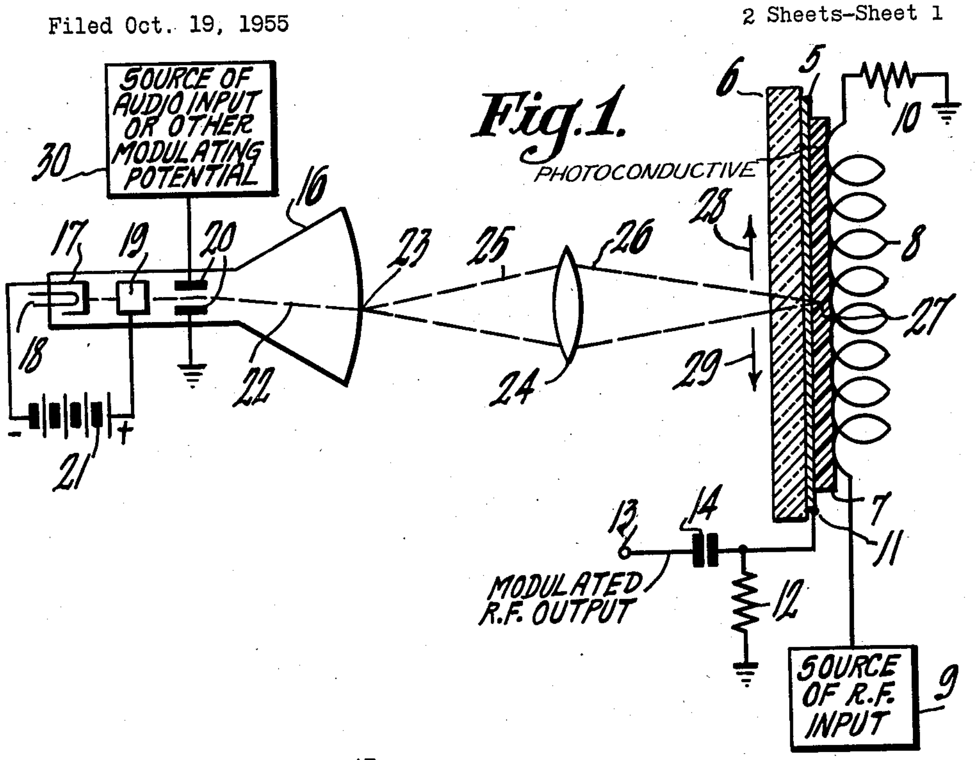
Figure 1 shows one embodiment of a phase modulating device constructed according to the invention.
Figure 2:
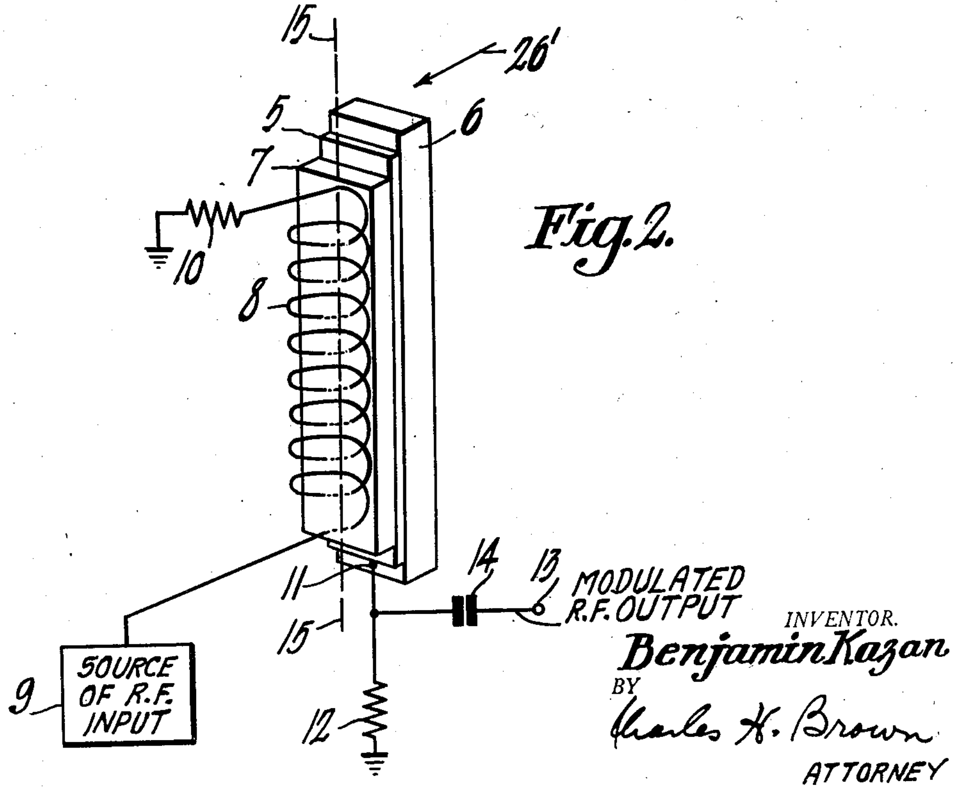
Figure 2 is a side elevation of the phase modulating device shown in Figure 1.

Referring to the drawing, Figures 1 and 2 show one embodiment of a phase modulating device constructed according to the invention. The photoconductive device of the invention includes a transparent conducting coating 5 placed so as to substantially cover a surface of a transparent glass plate 6. The glass plate 6 may be rectangular in shape. The conducting coating 5 may, for example, be stannous chloride or stannous oxide. The use of such coating material in this manner is known in the art, and the coating may be applied using any of the conventional procedures. The conducting coating 5 need only be a fraction of a mil in thickness to provide a good conducting surface on the glass plate 6 and may be sprayed on the glass. A layer of photoconductive material 7 is then placed in contact with the conducting coating 5 so as to cover the opposite surface area of the conducting coating 5. In the arrangement shown in Figures 1 and 2, the photoconductive material is prepared in powdered form and bonded in plastic. Cadmium sulfide or cadmium selenide powder may be used as the photoconductive material. However, any of the semiconductor materials which exhibit photoconductive properties may be used. The photoconductive material included in the layer 7 is prepared in a conventional manner. One method of preparation is discussed in copending United States patent application Serial No. 472,354, filed 1 December 1954 by S. M. Thomsen and C. J. Busanovich for Photoconducting Powders.

A standard delay line in the form of a helical coiled winding 8 is placed in contact with the surface of the layer 7 opposite to the surface of the layer 7 which is in contact with the conducting coating 5. The winding 8 is constructed of a conducting meterial, for example, copper wire, and comprises a plurality of turns of equal dimensions, the winding 8 being of sufficeint length to cover the elongated surface of the layer 7. The overall lengths of photoconductive layer 7 and winding 8 should be at least an integral number of wavelengths long at the operating radio frequency to be applied to the winding 8 as described hereinafter. The number of turns and the dimensions of the turns in the winding 8 are determined in accordance with the dimensions of the layer 7 used in a particular application. Each turn of the winding 8 is placed so as to make a point contact with the layer 7, the contact points of the turns being spaced apart an equal distance along the length of the winding 8. As shown more clearly in Figure 2, the points of contact between the winding 8 and the layer 7 are placed so as to fall on an imaginary center line, shown as dotted line 15, drawn along the length of the layer 7. The contact points may be made by merely embedding each turn of the winding 8 in the plastic bonding agent of the layer 7. If desired, small areas of a metallic coating, not shown, can be applied to the surface of the layer 7 at each point of contact between the winding 8 and the layer 7, the respective turns of the winding 8 being embedded in the metallic coatings or secured thereto by soldering and so on.

A source of radio frequency waves 9 is connected to one end of the winding 8 of the delay line, the other end of the winding 8 being connected to ground over a path including a terminating resistor 10. The term ground, as used in the specification, is to be understood as referring to a point of fixed or zero alternating reference potential. The conducting coating 5 is connected by means of an electrical connection 11 to ground over a path including a load resistor 12 and to an output terminal 13 over a path including a radio frequency blocking condenser 14.

A cathode ray tube 16 faces the surface of the glass plate 6 opposite the surface upon which the conducting coating 5, layer 7 and winding 8 are mounted. The cathode ray tube 16 is of conventional design, and is shown in simplified form in Figure 1. The tube 16 includes the usual gun structure and comprises a cathode 17, heating element 18, accelerating electrode 19 and the usual deflection plates 20. The cathode 17 is connected to the negative terminal of a source of unidirectional potential, shown as a high voltage battery 21. The accelerating electrode 19 is connected to the cathode 17 through the positive side of the battery 21 and operates to accelerate the electron beam 22 in the cathode ray tube 16. A source of audio frequency signals or other modulating potential 30 is connected to one of the deflection plates 20, the second deflection plate 20 being connected to ground in a conventional manner. A spot of light 23 is formed on the face of the tube 16 by the impingement of the electron beam 22 on a suitable phosphor coating, not shown. The spot of light, which may be visible, X-ray, infra-red or ultraviolet light, is projected from the face of the tube 16 onto an optical lens 24 over a light path, shown as dotted lines 25. The lens 24 focuses the light rays travelling over the path 25 into a second light path, represented by dotted lines 26 in Figure 1 and by a directional arrow 26′ in Figure 2, in such a manner that the light rays passing through the transparent glass plate 6 and the transparent conducting coating 5 are focused into a spot of light 27 at a particular point within the body of the layer of photoconductive material 7. In order to ensure the proper operation of the invention, it is important that the spot of light 27 be projected into the body of the layer 7 at a point immediately adjacent to a point of contact between the winding 8 and the layer 7, the respective points of contact being arranged on the imaginary line represented by the dotted line 15 shown in Figure 2.

The modulating potential applied to the deflection plates 20 from the source 30 causes the electron beam 22 to be deflected in a straight line back and forth across the face of the tube 16. In the arrangement shown in Figure 1, the electron beam 22 is caused to be deflected in a plane parallel to the surface of the drawing. As the electron beam 22 is deflected in accordance with the alternations in the level of the modulating potential, the spot of light 23 appearing on the face of the tube 16 travels in a straight line back and forth across the face of the tube 16 in a plane correspoding to that traversed by the electron beam 22. The angle of projection of the light rays radiated from the light spot 23 onto the surface of lens 24 and travelling over the light path 25 changes according to the movement of the light spot 23. As a result, the angle of projection of the light rays travelling over the light path 26 and focused into the light spot 27 by lens 24 also changes in corresponding degree. The light spot 27 is deflected in position back and forth along the length of the layer 7 on a line parallel to the imaginary line 15 drawn through the contact points between the winding 8 and layer 7. The invention, of course, is not limited to the particular optical system for producing the light spot 27 shown in Figure 1. Other optical arrangements are possible. Modulated light sources other than a cathode ray tube are found in the art and can be readily adapted for use in the invention. It is only necessary that the spot of light 27 be produced in such a manner that the deflection in position of the spot of light 27 causes it to move back and forth along the length of the layer 7 on a line parallel to a line drawn through the contact points between the winding 8 and the layer 7. The dimensions of the glass plate 6 and, therefore, of the conducting coating 5 and layer 7 are chosen to enable operation with the type of optical lens system and light source available for use in a particular application.

In operation, a radio frequency wave or signal, for example, in the range of 3,000 mcs., is applied from the source 9 to one end of the winding 8. The source 9 is arranged to include control means for maintaining the phase and voltage of the radio frequency wave constant. Radio frequency signal sources of this type are known in the art, and the source 9 shown in Figure 1, in itself, forms no part of the present invention. The other end of the winding is terminated by the resistor 10 to prevent reflection of waves back over the winding 8. Neglecting attenuation of the waves travelling over winding 8, the phase of the radio frequency wave varies from point to point along the length of the winding 8. In the absence of illumination of a point in the body of layer 7, the alternating current impedance of the photoconductive material is relatively high adding to the distributed capacity of the winding 8 of the delay line. By constructing the winding 8 so that it is an integral number of radio frequency wavelengths long, the phases of the radio frequency signal cancel out when there are no light rays impinging on plate 6. The layer 7 acts as a high impedance preventing current flow between the winding 8 and the conducting coating 5 in this condition. To lower the capacitive coupling of the conducting coating 5 to the winding 8 during periods in which the layer 7 is not illuminated, the layer of photoconductive material 7 can be made relatively thick, for example, ten mils.

When the spot of light 27 is focused on a particular point in the body of the layer 7, the impedance of the photoconductive material in the area illuminated is lowered. The conducting coating 5 is coupled to the particular contact point between the winding 8 and layer 7 immediately adjacent the point in the body of the layer 7 which is illuminated. A radio frequency wave of a phase corresponding to the phase of the radio frequency wave appearing at that particular contact point is coupled to the conducting coating 5 and appears across the load resistor 12 over a path including connection 11. The signal is, thereafter, applied from the load resistor 12 to the output terminal 13. By applying a modulating potential to the light source, cathode ray tube 16, the spot of light 27 is deflected in position along the length of the layer 7 in accordance with the level of the modulating potential. As the spot of light 27 alternately moves back and forth in the direction of the arrows 28 and 29 along the body of the layer 7, first one contact point between the winding 8 and the layer 7 is coupled to the conducting coating 5; thereafter, a second contact point is coupled to the conducting coating 5 and so on. The deflection of the position of the spot of light 27, by altering the electrical impedance characteristics of the photoconductive material at various points in the body of the layer 7, causes different phases of the radio frequency signal applied to the winding 8 to be coupled to the conducting coating 5. In other words, the phases of the radio frequency signal coupled to the conducting coating 5 are determined in accordance with the level of the modulating potential used to deflect the position of the spot of light 27. A phase modulated radio frequency signal appears on the conducting coating 5 and output terminal 13. It will thus be seen that a phase modulating device is provided by the invention which is both simple in operation and includes simple circuit elements.

Reference has been made to the fact that visible, infra-red, X-ray or ultraviolet light may be used to form the activating spot of light 27. As photoconductive materials are not all equally photosensitive to the same frequency ranges of light energy, the photoconductive material used in the formation of the layer 7 is chosen in accordance with type of operation desired. In using a photoconductive material which is sensitive to visible light, the phase modulating device would necessarily have to be enclosed in a dark enclosure, not shown, the spot of visible light 27 being the only light energy permitted to impinge on the body of the layer 7. When a non-visible infra-red, X-ray or ultraviolet light source is used, a photoconductive material particularly photosensitive to these frequency ranges of light energy can be used in the formation of layer 7. In the latter applications, the phase modulating device of the invention could be operated in an open room, assuming, of course, that the ambient light in the room contains a minimum of infra-red, X-ray or ultraviolet light.

Figure 3:
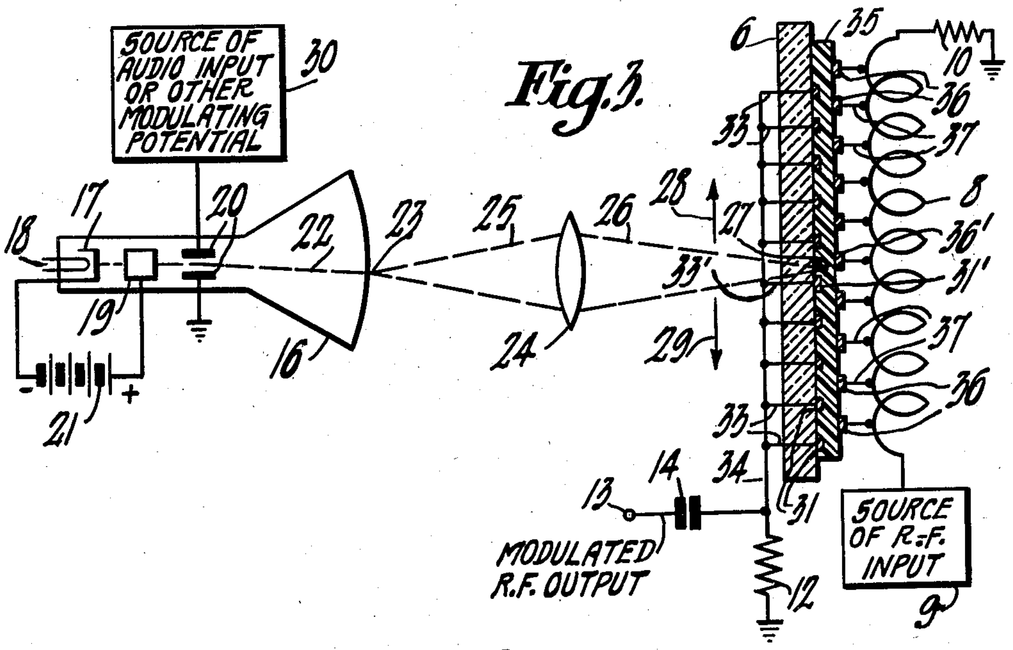
Figure 3 shows another embodiment of a phase modulating device constructed according to the invention; and, Figure 4 is a side elevation, partly in section, of the phase modulating device shown in Figure 3.
Figure 4:
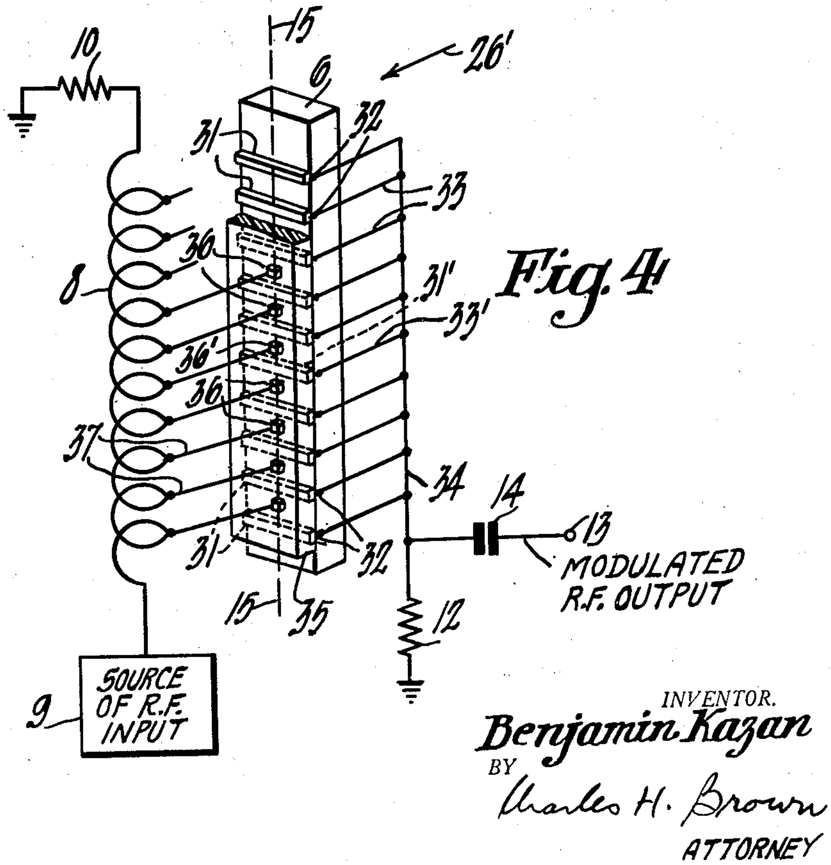

In the embodiment of the invention shown in Figures 1 and 2, the photoconductive material was assumed to be in powdered form bonded in plastic to produce the layer 7. If desired, the photo conductive material, for example, cadmium sulfide or cadmium selenide, can be used in a very thin layer by the use of sintering or evaporating procedures. An embodiment of the invention including the latter use of the photoconductive material is shown in Figures 3 and 4. The overall operation of the embodiment of the invention shown in Figures 3 and 4 is exactly the same as that of the embodiment of the invention shown in Figures 1 and 2. For ease of description, the same circuit elements in each embodiment have been given the same numerical identification. The transparent conducting coating instead of being arranged in a solid coating 5 along a surface of the glass plate 6, as shown in Figures 1 and 2, is arranged in a pattern of lines 31 along a surface of the plate 6. The lines 31 are drawn by applying the conducting coating material, for example, stannous chloride, across the width of the surface of the plate 6, the lines 31 being spaced an equal distance apart along the surface of the plate 6. The lines 31 are of relatively small dimensions, and need only be of a sufficient width and thickness to provide a conducting surface to which an electrical connection can be made. One end of each of the lines 31 is connected by means of a soldered or other electrical connection 32 to a separate lead 33, the respective leads 33 being connected to one end of a common output lead 34. The other end of lead 34 is connected to ground over a path including the load resistor 12 and to the output terminal 13 over a path including radio frequency blocking condenser 14. A thin layer 35 of photoconductive material having a thickness of a fraction of a mil and in the form of sintered cadmium sulfide or cadmium selenide or evaporated materials of this type, for example, is applied to the surface of the plate 6 so as to cover the lines 31 of the conducting coating. Small areas of a conducting coating 36 are placed along the length of the surface of the layer 35 opposite to the surface of the layer 35 which is in contact with the plate 6 and the lines of conducting material 31. The conducting areas or contact points 36 may be made by the application of any electrically conductive metallic coating to the surface of the layer 35 in a conventional manner. The contact points 36 are spaced an equal distance apart along an imaginary center line, shown as dotted line 15 in Figure 4, and are placed so that a single contact point 36 is positioned half way between each adjacent pair of the lines 31 of conducting material.

For ease of construction, the winding 8 may be placed in contact with the layer 35 by a plurality of standoff leads 37. The leads 37, while of identical length, may be any length desired. Each turn of the winding 8 is connected by one of the leads 37 to one of the contact points 36 on the surface of the layer 36, providing an electrical connection between the winding 8 and the layer 35. The connections made to the turns of the winding 8 by the leads 37 are spaced an equal distance apart along the length of the winding 8. A radio frequency signal is applied to one end of the winding 8 from the source 9, the other end of the winding 8 being connected to ground over a path including terminating resistor 10. Different phases of the radio frequency signal appear at the respective contact points 36 along the length of the winding 8.

The spot of light 27 is produced in exactly the same manner as in the embodiment of the invention shown in Figures 1 and 2. While a cathode ray tube 16 is shown, any suitable means well known in the art may be used to produce the spot of light 27. The spot of light 27 is focused so as to illuminate the area between a line 31 and the immediately adjacent contact point 36 at a particular point along the imaginary center line, shown as dotted line 15 in Figure 4. It should be noted at this time that the lines 31 of conducting material, instead of being placed between the layer 35 and the surface of the glass plate 6, as shown in Figures 3 and 4, may be placed on the outside surface of the layer 35 between the contact points 36. In either arrangement the operation of the invention is the same. When no point in the body of the layer 35 is illuminated, the photoconductive material of the layer 35 exhibits a high electrical impedance. The coupling between the winding 8 and, more particularly, the contact points 36 and the lines 31 is at a minimum.

When the spot of light 27 is focused at a particular point in the body of the layer 35, the electrical impedance of the photoconductive material in the illuminated area surrounding that point is lowered. For example, in the embodiment shown in Figures 3 and 4, the spot of light is focused so as to illuminate the area of the layer 35 of photoconductive material between the line 31′ of conducting material and the contact point 36′. The phase of the radio frequency signal appearing at contact point 36′ is coupled to the conducting line 31′. The signal is fed from line 31′ across load resistor 12 over a path including lead 33′ and lead 34, the signal being applied from the resistor 12 to the output terminal 13. As the position of the spot of light 27 is deflected in accordance with the level of a modulating potential applied to the deflection plates 20 of cathode ray tube 16 from source 30, the spot of light 27 moves back and forth in the direction of the arrows 28 and 29 on a line parallel to the imaginary line 15 drawn through the contact points 36. As the spot of light 27 moves back and forth along the layer 35, the various points in the body of the layer 35 between the contact points 36 and the respective immediately adjacent lines 31 are illuminated. The winding 8 is coupled by means of the contact points 36 to first one of the lines 31 and, thereafter, to a second one of the lines 31 and so on. The deflection of the position of the spot of light 27, by lowering the electrical impedance characteristics of the photoconductive material at various points in the body of the layer 35, causes different phases of the radio frequency signal at the respective contact points 36 to be selectively coupled to the lines 31. The phases of the radio frequency signal coupled to lines 31 are determined in accordance with the level of the modulating potential used to deflect the position of the spot of light 27. The phase modulated radio frequency signal is fed from the respective lines 31 across the load resistor 12 by means of the connections 32 and leads 33, the modulated signal being applied to the output terminal 13 from the resistor 12. The phase modulating device of the invention, as shown in the embodiment given in Figures 3 and 4, is both simple in operation and constructed of simple circuit elements.

The invention has been described in connection with a delay line in the form of a helical coiled winding 8. Actually, other types of delay lines can be used with the same results, if desired. For example, a lumped constant delay line which is electrically equivalent to the delay line shown in the drawing could be used. The lumped constant delay line would be placed so as to contact the layer of photoconductive material at points corresponding to each section of the line, the operation of the invention remaining the same as has been described above.

For the above embodiments, the focused light spot 27 may easily have an illuminance of one hundred foot candles or more, thus, permitting relatively insensitive photoconductive materials to be used with a response time of a fraction of a millisecond or less. With such photoconductive materials, audio modulation of the radio frequency phase can be readily obtained. It should be noted that, while the discussion has been directed to the use of a spot of light 27, the source of light may be arranged in a manner to produce a narrow band of light across the entire width of the body of the layer of photoconductive material, illuminating a larger area of the photoconductive material. In the embodiment shown in Figures 3 and 4, it may be desirable to extend the size of the contact points 36 into lines drawn across the width of the layer 35 parallel to the lines 31. By so extending the dimensions of the contact points 36, coupling could be obtained across the entire width of the layer 35 between the contact points 36 in the form of lines and the lines 31. The operation of the invention, as described above, would remain the same in all other respects.

As is well understood in the use of photoconductive materials, the photosensitivity of the material or, in other words, the amount the impedance of the photoconductive material is lowered in response to illumination from a light source is directly related and frequently proportional to the intensity of the illumination. As the intensity of illumination increases within the range of the photosensitivity of a particular photoconductive material, the impedance of the photoconductive material within the illumination area decreases. This characteristic of photoconductive materials could be used in an embodiment of the invention to double modulate the radio frequency signal. Instead of using a source of constant intensity light energy, as shown in the drawing, the negative potential applied to the cathode 17 of tube 16 could be modulated by a suitable means, not shown. The spot of light 27, in addition to being deflected in position to produce phase modulation of the radio frequency signal, would be varied in intensity. The degree of coupling between the winding 8 and the conducting coating, whether it is in the form of a solid coating 5 shown in Figure 1 or in a pattern of lines 31 shown in Figure 3, is dependent upon the impedance of the layer of photoconductive material therebetween. As the impedance at the various illuminated points in the body of the layer of photoconductive material varies in accordance with the intensity of the deflected spot of light 27, the degree of coupling also varies. In this manner the radio frequency signal appearing across load resistor 12 is both phase modulated and amplitude modulated. The double modulated radio frequency signal can, thereafter, be fed by means of output terminal 13 to suitable utilization circuits.

Having described the invention, I claim:

1. A photoconductive device comprising, in combination, a layer of photoconductive material, a delay line placed in contact with a surface of said layer at spaced points along an imaginary line, adjacent points of contact being separated from one another by an appreciable fraction of a wavelength at the operating frequency, means for applying signal energy to one end of said delay line, a resistive device connected to and terminating the other end of said delay line and a coating of transparent conducting material secured to the opposite surface of said layer.

2. A photoconductive device comprising, in combination, a layer of photoconductive material, a delay line in the form of a helical coiled winding placed in contact along a surface of said layer at spaced points along an imaginary straight line, means for applying signal energy to one end of said delayed line, a resistive device connected to and terminating the other end of said delay line and a coating of transparent conducting material secured to the opposite surface of said layer.

3. A photoconductive device comprising, in combination, a glass plate, a coating of transparent conducting material placed on a surface of said plate, a layer of photoconductive material placed in contact with and covering said coating, a delay line in the form of a helical coiled winding placed in contact at spaced points along the surface of said layer opposite to the surface in contact with said coating, means for applying signal energy to one end of said delay line, and a resistor connected to and terminating the other end of said delay line.

4. A photoconductive device in accordance with claim 3, wherein said coating of transparent conducting material is in the form of physically spaced parallel lines.

5. A phase modulating system comprising, in combination, a layer of photoconductive material, a coating of transparent conducting material placed on a surface of said layer, a delay means in electrical contact with said layer at spaced points along the length thereof, said delay means extending along a surface of said layer in a plane parallel to that of said coated surface of said layer, a source of signal energy coupled to one end of said delay means, a resistor terminating the other end of said delay means, a source of light energy, means for focusing the light rays radiated from said light source through said coating upon a particular area in the body of said layer, a source of modulating potential, means for modulating said light source by said modulating potential, said light rays being deflected in position along the length of said delay means according to the level of said modulating potential, and an output circuit connected to said coating.

6. A phase modulating system as defined in claim 5, wherein the value of said resistor is such as to prevent wave reflections along said delay means.

7. A phase modulating system comprising, in combination, a layer of photoconductive material, a coating of transparent conducting material placed on a surface of said layer, a delay line in the form of a helical coiled winding in electrical contact with said layer at spaced points along the length thereof, said winding extending in a plane parallel to that of said coated surface of said layer, a source of radio frequency signals coupled to one end of said winding, a resistor terminating the other end of said winding, a source of light energy, means for focusing the light rays radiated from said light source through said coating upon a particular area in the body of said layer, a source of modulating potential, means for modulating said light source by said modulating potential, said light rays being deflected in position along the length of said winding according to the level of said modulating potential, and an output circuit connected to said coating.

8. A phase modulating system comprising, in combination, a layer of photoconductive material, a coating of transparent conducting material placed on a surface of said layer, a delay line in the form of a helical coiled winding in electrical contact with said layer, said winding extending in a plane parallel to that of said coated surface of said layer and including a plurality of turns of equal dimensions and evenly spaced along the length of said winding, each of said turns making an electrical contact between said layer and said winding, a source of radio frequency signals coupled to one end of said winding, a resistor terminating the other end of said winding, a source of light energy, means for focusing the light rays radiated from said light source through said coating into a spot of light upon a particular point in the body of said layer, a source of modulating potential, means for modulating said light source by said modulating potential, said light rays being deflected in position along the length of said winding according to the level of said modulating potential, and an output circuit connected to said coating.

9. A phase modulating system comprising, in combination, a layer of photoconductive material, a coating of transparent conducting material placed on a surface of said layer, a delay line in the form of a helical coiled winding, said winding including a plurality of turns of equal dimensions and evenly spaced along the length of said winding, means for connecting each of said turns to separate points of contact on a surface of said layer, said points of contact being arranged along an imaginary line on the surface of said layer in a plane parallel to that of said coated surface of said layer, a source of radio frequency signals coupled to one end of said winding, a resistor terminating the other end of said winding, a cathode ray tube, means for producing a spot of light on the face of said tube, an optical lens, said optical lens being arranged to focus the light rays radiated from said spot of light through said coating upon a particular point in the body of said layer, a source of modulating potential, means for deflecting said spot of light in accordance with the level of said modulating potential, said light rays being deflected in position along the length of said winding in accordance with the movement of said spot of light, and an output circuit connected to said coating.

10. A phase modulating system comprising, in combination, a plate of transparent material, a transparent coating of conducting material placed on a surface of said plate, a layer of photoconductive material placed so as to cover said coating in contact relationship, a delay line in electrical contact with the surface of said layer opposite to that in contact with said coating, a source of signal energy coupled to one end of said delay line, a resistor terminating the other end of said delay line, a source of light energy, means for focusing the light rays radiated from said light source through said plate and said coating upon a particular area in the body of said layer, a source of modulating potential, means for modulating said light source by said modulating potential, said light rays being deflected in position along the length of said delay line according to the level of said modulating potential, and an output circuit connected to said coating.

11. A phase modulating system comprising, in combination, a plate of transparent material, a transparent coating of conducting material placed on a surface of said plate, a layer of photo-conductive material placed so as to cover said coating in contact relationship, a delay line in the form of a helical coiled winding in electrical contact with said layer, said winding extending along a surface of said layer in a plane parallel to that of said coated surface of said plate, a source of radio frequency signals coupled to one end of said winding, a resistor terminating the other end of said winding, a source of light energy, means for focusing the light rays radiated from said light source through said plate and said coating upon a particular area in the body of said layer, a source of modulating potential, means for modulating said light source by said modulating potential, said light rays being deflected in position along the length of said winding according to the level of said modulating potential, and an output circuit connected to said coating.

12. A phase modulating system comprising, in combination, a plate of transparent material, a transparent coating of conducting material placed on a surface of said plate, a layer of photo-conductive material placed so as to cover said coating in contact relationship, a delay line in the form of a helical coiled winding in electrical contact with said layer, said winding extending along a surface of said layer in a plane parallel to that of said coated surface of said plate and including plurality of turns of equal dimensions and evenly spaced along the length of said winding, each of said turns making an electrical contact between said layer and said winding, the adjacent points of contact being separated from one another by an appreciable fraction of a wavelength at the operating frequency, a source of radio frequency signals coupled to one end of said winding, a resistor terminating the other end of said winding, a source of light energy, an optical lens system, means including said optical lens system for focusing the light rays radiated from said light source through said plate and said coating upon a particular point in the body of said layer, a source of modulating potential, means for modulating said light source by said modulating potential, said light rays being deflected in position along the length of said winding according to the level of said modulating potential, and an output circuit connected to said coating.

13. A phase modulating system comprising, in combination, a plate of transparent material, a transparent coating of conducting material placed on a surface of said plate, a layer of photo-conductive material placed so as to cover said coating in contact relationship, a delay line in the form of a helical coiled winding, said winding including a plurality of turns of equal dimensions and evenly spaced along the length of said winding, each of said turns being connected to separate points of contact on a surface of said layer, said contact points being arranged along an imaginary line on the surface of said layer in a plane parallel to that of said coated surface of said plate, adjacent points of contact being separated from one another by an appreciable fraction of a wavelength at the operating frequency, a source of radio frequency signals coupled to one end of said winding, a resistor terminating the other end of said winding of a value to prevent reflections along said winding, a cathode ray tube, means for producing a spot of light on the face of said tube, an optical lens, said lens being arranged to focus the light rays radiated from said spot of light through said plate and said coating upon a particular point in the body of said layer, a source of modulating potential, means for deflecting said spot of light in accordance with the level of said modulating potential, said light rays being deflected in position along the length of said winding in accordance with the movement of said spot of light, a load resistor connected to said coating, and an output circuit connected to said load resistor.

14. A phase modulating system comprising, in combination, a layer of photoconductive material, said layer including powdered photoconductive material bonded in plastic, a coating of transparent conducting material placed on a surface of said layer in a predetermined manner, a delay line in electrical contact with said layer, said delay line extending along a surface of said layer in a plane parallel to that of said coated surface of said layer, a source of signal energy coupled to one end of said delay line, a resistor terminating the other end of said delay line, a source of light energy, means for focusing the light rays radiated from said light source through said coating upon a particular area in the body of said layer, a source of modulating potential, means for modulating said light source by said modulating potential, said light rays being deflected in position along the length of said delay line according to the level of said modulating potential, and an output circuit connected to said coating.

15. A phase modulating system comprising, in combination, a layer of photoconductive material, said layer including powdered photoconductive material bonded in plastic, a coating of transparent conducting material placed on a surface of said layer, a delay line in the form of a helical coiled winding in electrical contact with said layer, said winding extending along a surface of said layer in a plane parallel to that of said coated surface of said layer and including a plurality of turns of equal dimensions and evenly spaced along the length of said winding, each of said turns being embedded in the plastic bonding agent of said layer at contact points separated from one another by an appreciable fraction of a wavelength at the operating frequency, a source of radio frequency signals coupled to one end of said winding, a resistor terminating the other end of said winding, a source of light energy, means for focusing the light rays radiated from said light source through said coating into a spot of light upon a particular point in the body of said layer, a source of modulating potential, means for modulating said light source by said modulating potential, said light rays being deflected in position along the length of said winding according to the level of said modulating potential, and an output circuit connected to said coating.

16. A phase modulating system comprising, in combination, a plate of transparent material, a transparent coating of conducting material placed on a surface of said plate, a layer of photoconductive material placed so as to cover said coating in contact relationship, said layer including a powdered photoconductive material bonded in plastic, a delay line in electrical contact with the surface of said layer opposite to that in contact with said coating, a source of signal energy coupled to one end of said delay line, a resistor terminating the other end of said delay line, a source of light energy, means for focusing the light rays radiated from said light source through said plate and said coating upon a particular area in the body of said layer, a source of modulating potential, means for modulating said light source by said modulating potential, said light rays being deflected in position along the length of said delay line according to the level of said modulating potential, and an output circuit connected to said coating.

17. A phase modulating system comprising, in combination, a plate of transparent material, a transparent coating of conducting material placed on a surface of said plate, a layer of photoconductive material placed so as to cover said coating in contact relationship, said layer including a powdered photoconductive material bonded in plastic, a delay line in the form of a helical coiled winding, said winding including a plurality of turns of equal dimensions and evenly spaced along the length of said winding, each of said turns being embedded in said plastic at points of contact equally distant from one another along the surface of said layer opposite to said surface of said layer in contact relationship with said coating, adjacent points of contact being separated from one another by an appreciable fraction of a wavelength at the operating frequency, a source of radio frequency signals coupled to one end of said winding, a resistor terminating the other end of said winding of a value to prevent reflections along said winding, a cathode ray tube, means for producing a spot of light on the face of said tube, an optical lens, said lens being arranged to focus the light rays radiated from said spot of light through said plate and said coating upon a particular point in the body of said layer, a source of modulating potential, means for deflecting said spot of light across the face of said tube in accordance with the level of said modulating potential, said light rays being deflected in alternately opposite directions along the length of said winding, a load resistor connected to said coating, and an output circuit connected to said load resistor.

18. A phase modulating system comprising, in combination, a plate of transparent material, a layer of photoconductive material placed so as to cover a surface of said plate, a coating of transparent conducting material in the form of a plurality of lines placed on a surface of said layer in a plane parallel to that of said covered surface of said plate, said lines being of equal dimensions and evenly spaced along said coated surface of said layer, a delay line in the form of a helical coiled winding including a plurality of turns of equal dimensions and evenly spaced along the length of said winding, a plurality of points of contact arranged on an imaginary straight line along said coated surface of said layer, said points of contact being individually positioned halfway between each adjacent pair of said lines, means for connecting each of said turns to a separate one of said points of contact, a source of electric energy coupled to one end of said winding, a resistor terminating the other end of said winding, a source of light energy, means for focusing the light rays radiated from said light source through said plate upon a particular area in the body of said layer, a source of modulating potential, means for modulating said light source by said modulating potential, said light rays being deflected in position so as to be selectively located immediately adjacent different ones of said points of contact in accordance with the level of said modulating potential, and an output circuit connected to each of said lines.

19. A phase modulating system comprising, in combination, a plate of transparent material, a coating of transparent conducting material in the form of a plurality of lines placed on a surface of said plate, said lines being of equal dimensions and evenly spaced along the surface of said plate, a layer of photoconductive material placed so as to cover said coated surface of said plate in contact relationship, a delay line in the form of a helical coiled winding including a plurality of turns evenly spaced along the length of said winding, a plurality of points of contact arranged on an imaginary straight line along the surface of said layer opposite the surface of said layer in contact with said coated surface of said plate, said points of contact being individually located on the surface of said layer halfway between each adjacent pair of said lines, means for connecting each of said turns to a separate one of said points of contact, adjacent points of contact being separated from one another by an appreciable fraction of a wavelength at the operating frequency, a source of radio frequency signals coupled to one end of said winding, a resistor terminating the other end of said winding, a source of light energy, means for focusing the light rays radiated from said light source through said plate and said lines upon a particular point in the body of said layer, a source of modulating potential, means for modulating said light source by said modulating potential, said light rays being deflected in position so as to be selectively located immediately adjacent different ones of said points of contact in accordance with the level of said modulating potential, and an output circuit connected to said coating.

20. A phase modulating system comprising, in combination, a transparent glass plate, a coating of transparent conducting material in the form of a plurality of lines placed on a surface of said plate, said lines being of equal dimensions and evenly spaced along the surface of said plate, a layer of photoconductive material placed so as to cover said coated surface of said plate in contact relationship, a delay line in the form of a helical coiled winding including a plurality of turns evenly spaced along the length of said winding, a plurality of points of contact arranged on an imaginary straight line along the surface of said layer opposite the surface of said layer in contact with said coated surface of said plate, said points of contact being individually located on the surface of said layer halfway between each adjacent pair of said lines, each of said turns being connected to a separate one of said points of contact by a standoff electrical connection, a source of radio frequency signals coupled to one end of said winding, a resistor terminating the other end of said winding of a value preventing reflections along said winding, a cathode ray tube, means for producing a light image on the face of said tube, an optical lens system, said lens system arranged to focus the light rays radiated from said light image through said plate and said lines upon a particular point in the body of said layer, a source of modulating potential, means for deflecting said light image across said face of said tube in accordance with the level of said modulating potential, said light rays being deflected in position in accordance with the movement of said light image so as to be selectively located immediately adjacent different ones of said points of contact as determined by the level of said modulating potential, means for connecting a load resistor to each of said lines, and an output circuit connected to said load resistor.

21. A modulation system comprising, in combination, a dielectric plate, means for applying a concentrated beam of energy representative of modulation potential to one side of said plate, means for deflecting said beam over an appreciable area of said dielectric plate, a delay line in contact at several points with the other side of said dielectric plate and extending over said area, means for applying wave energy to be delayed to one end of said line, and a resistor having a value substantially equal to the characteristic impedance of said delay line terminating the other end of said line.

References Cited in the file of this patent

UNITED STATES PATENTS

| | | |
|---|---|---|
| 1,601,607 | Wein | Sept. 28, 1926 |
| 1,979,463 | Goshaw | Nov. 6, 1934 |
| 2,098,236 | Golay | Nov. 9, 1937 |
| 2,248,985 | Gray | July 15, 1941 |
| 2,654,071 | Harris | Sept. 29, 1953 |